United States Patent [19]

Ting et al.

[11] Patent Number: 6,017,820
[45] Date of Patent: Jan. 25, 2000

[54] INTEGRATED VACUUM AND PLATING CLUSTER SYSTEM

[75] Inventors: Chiu H. Ting, Saratoga; William H. Holtkamp, San Jose, both of Calif.

[73] Assignee: Cutek Research, Inc., San Jose, Calif.

[21] Appl. No.: 09/118,982

[22] Filed: Jul. 17, 1998

[51] Int. Cl.[7] .................................................. H01L 21/44
[52] U.S. Cl. .......................................... 438/689; 156/345
[58] Field of Search ....................... 156/345 L, 345 WH, 156/345 MC, 345 PC, 345 PW; 438/710, 729, 745, 689.694; 205/123

[56] References Cited

U.S. PATENT DOCUMENTS

| | | |
|---|---|---|
| 5,000,827 | 3/1991 | Schuster et al. . |
| 5,024,746 | 6/1991 | Stierman et al. . |
| 5,076,205 | 12/1991 | Vowles et al. ....................... 156/345 X |
| 5,135,608 | 8/1992 | Okutani ............................... 156/348 X |
| 5,256,274 | 10/1993 | Poris . |
| 5,368,711 | 11/1994 | Poris . |
| 5,429,733 | 7/1995 | Ishida . |
| 5,437,777 | 8/1995 | Kishi . |
| 5,441,629 | 8/1995 | Kosaki . |
| 5,447,615 | 9/1995 | Ishida . |
| 5,516,414 | 5/1996 | Glafenhein et al. . |
| 5,830,805 | 11/1998 | Schacham-Diamand et al. . |
| 5,853,559 | 12/1998 | Tamaki et al. . |

FOREIGN PATENT DOCUMENTS 2628886  7/1997  Japan .

OTHER PUBLICATIONS

Contolini, R., et al., A Copper Via Plug Process by Electrochemical Planarization, 1993 VMIC Conference–102/93/0470, Jun. 8–9, 1993, pp. 470–477.

Pai, Pei–Lin & Ting, Chiu, Copper as the Future Interconnection Material, 1989 VMIC Conference, TH–0259–2/89/0000–0258, Jun. 12–13, 1989, pp. 258–264.

Contolini, R., et al., Copper Electroplating Process for Sub–Half–Micron ULSI Structures, 1995 VMIC Conference—104/95/0322, Jun. 27–29, 1995, pp. 322–328.

Ting, Chiu H., et al., Recent Advances in Cu Metallization, 1996 VMIC Conference, 106/96/0481(c), Jun. 18–20, 1996, pp. 481–486.

Contolini, Robert J., et al., Electrochemical Planarization for Multilevel Metallization, J. Electrochem. Soc., vol. 141, No. 9, Sep. 1994, pp. 2503–2510.

Equinox—Single Substrate Processing System, A Semitool Brochure, EQU025–Apr. 94, pp. 1.8–8.8.

*Primary Examiner*—William Powell
*Attorney, Agent, or Firm*—Blakely, Sokoloff, Taylor & Zafman

[57] ABSTRACT

An apparatus and method for providing an integrated processing system allowing for the isolation of non-compatible processes used to deposit a material onto a semiconductor wafer and/or remove material from a wafer is described. The integrated processing system of the present invention is comprised of a first processing chamber for processing a substrate in a first environment coupled to a second processing chamber for processing a substrate in a second environment. A connecting interface coupled to the first and second processing chambers allows the first and second processing chambers to be isolated from each other as needed. Further, the connecting interface allows a wafer to be transferred from the first processing chamber to the second processing chamber within a controlled environment. The first and second processing chambers may be or may include cluster tools.

18 Claims, 5 Drawing Sheets

INTEGRATED VACUUM AND PLATING CLUSTER SYSTEM

BACKGROUND OF THE INVENTION

1. Field of the Invention

The present invention relates to the field of semiconductor wafer processing, and more particularly, to an integrated processing system for use with non-compatible processing steps.

2. Related Applications

The present invention is related to the U.S. patent application entitled "Process Chamber and Method for Depositing and/or Removing Material on a Substrate," Ser. No. 08/916,564, filed Aug. 22, 1997, and the U.S. patent application entitled "Multiple Station Processing Chamber and Method for Depositing and/or Removing Material on a Substrate", Ser. No. 09/118,664, filed Jul. 17, 1998, each of which is incorporated herein by reference.

3. Description of the Related Art

In order to fabricate features, circuits, and devices on a substrate, such as a semiconductor wafer, various techniques may be used to deposit and etch materials on the substrate. Deposition techniques include processes such as physical vapor deposition (PVD), chemical vapor deposition (CVD), sputtering, and electrochemical deposition by immersing the substrate in an electrolyte solution. This last technique applies to both electroless deposition and electroplating.

Similarly, a number of techniques are known for removing a material from a wafer. These techniques include reactive ion etching (RIE), plasma etching, chemical-mechanical polishing (CMP), and immersion of the wafer in an electrolyte solution. Material removal by subjecting a wafer to an electrolyte is often referred to as electropolishing since in this instance charged particles are removed rather than deposited on the wafer.

Various processing chambers have been used in which a substrate, such as a semiconductor wafer, is exposed to one of the above processing steps. The processing chamber used to deposit and/or remove material on a wafer may be sealed to allow the process to occur in a vacuum or positive pressure. The process may also be performed at ambient pressure.

Processing chambers have been designed in which multiple processing stations or modules are arranged in a cluster to form a cluster tool. The cluster tools or systems are often used to process a multiple number of wafers at the same time. Generally, cluster tools are configured with multiple processing stations or modules. Radial cluster tools place these in a radial arrangement around a central handling mechanism and are designed to perform a certain type of processing operation. For example, plasma etching may be performed by a clustered etcher so that multiple wafers can be etched at the same time. The use of cluster tools to process semiconductor wafers, as well as the loading and unloading of wafers (or a cassette of wafers) is known in the art.

Since many processing steps are not compatible with one another, cluster tools are designed for a specific operation. For example, sputtering or CVD processing steps both typically require a vacuum environment, while the deposition plating processes can be performed at ambient pressure. For this reason, known cluster tools are generally designed to operate having a particular environmental condition. For a wafer to be processed within a different environment, it must be moved to another station or system. This requires a complete sequence of unloading, transporting, and reloading of the wafers.

The present invention describes a technique that allows the isolation of noncompatible processes used in semiconductor manufacturing, but in which processes requiring different environmental conditions can be made to operate together. The present invention describes an integrated processing system having processing chambers or modules coupled together to allow a wafer to be moved from one isolated processing chamber or module to another isolated processing chamber or module within a controlled environment. The present invention allows both multiple station processing chambers and cluster tools to be coupled together via a connecting interface to effect the transfer.

SUMMARY OF THE INVENTION

The present invention describes a technique that allows the isolation of noncompatible processes used in semiconductor manufacturing. The present invention comprises a first processing chamber for processing a substrate in a first environment coupled to a second processing chamber for processing a substrate in a second environment. A connecting interface coupled to the first and second processing chambers allows the first and second processing chambers to be isolated from each other as needed. Further, the connecting interface allows a substrate to be transferred from the first processing chamber to the second processing chamber within a controlled environment.

The present invention may also be comprised of a first cluster tool for processing a substrate in a first environment coupled to a second cluster tool for processing a substrate in a second environment. Each cluster tool may be comprised of a wafer handling mechanism having multiple processing chambers coupled to the wafer handling mechanism. An interface unit chamber may also be coupled to the wafer handling mechanism for loading and/or removing a wafer into/from the system. A connecting interface couples the wafer handling mechanism from the first cluster tool to the wafer handling mechanism of the second cluster tool, and allows the first and second cluster tools to be isolated from each other as needed. The connecting interface also allows wafers to be moved from the first cluster tool to the second cluster tool within a controlled environment.

DETAILED DESCRIPTION OF THE PRESENT INVENTION

An apparatus and method allowing for the isolation of non-compatible processes used to deposit a material onto a semiconductor wafer and/or remove material from a wafer is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well known techniques and structures have not been described in detail in order not to obscure the present invention.

It is to be noted that a preferred embodiment of the present invention is described in reference to the deposition of a metal material. The preferred material for the described deposition is copper. However, it is appreciated that the present invention can be readily adapted to the deposition of other metals and alloys (hereinafter, the term metal includes metal alloys) and dielectric materials as well. Furthermore, the present invention need not be limited strictly to semiconductor wafers. The invention can be readily adapted to processing materials on other substrates, including substrates utilized for packaging semiconductor devices such as bump formation or ceramic substrates, and the manufacturing of flat panel displays.

Additionally, the integrated processing system of the present invention can be utilized to electropolish materials from similar substrates. For ease of description, etching, polishing, deplating or otherwise removing material as practiced herein are all collectively referred to as electropolishing or polishing, in which an electrolyte and an electric field are utilized for material removal. The chamber structures described herein for depositing a material can be readily adapted for removing a particular material from a semiconductor wafer or other substrates.

Figure 1:
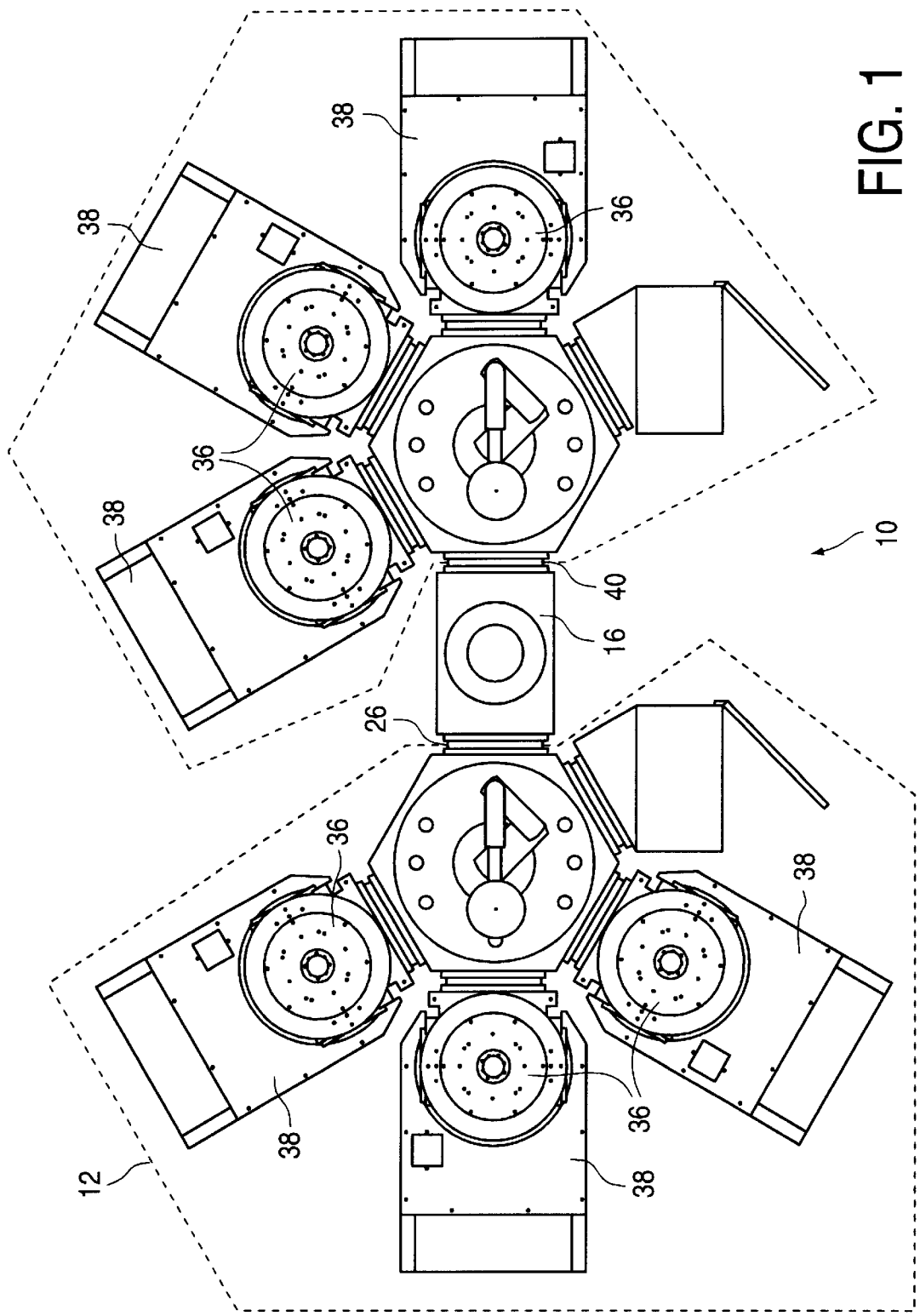
FIG. 1 is a top view of a first embodiment of the integrated processing system of the present invention.

FIG. 1 is a top view of a first embodiment of an integrated processing system 10 of the present invention. The integrated processing system 10 is comprised of a first wafer processing system (or cluster tool) 12 coupled to a second wafer processing system (or cluster tool) 14 by means of a connecting interface chamber 16. The connecting interface chamber 16 can be designed to allow the cluster tools 12 and 14 to be completely isolated from one another when two different environments are utilized. For example, cluster tool 12 may be used for sputtering or CVD processes, which may require a low pressure (such as a vacuum) environment. Cluster tool 14, however, might then be used for a plating process, which can be performed at atmospheric pressure.

Figure 2:
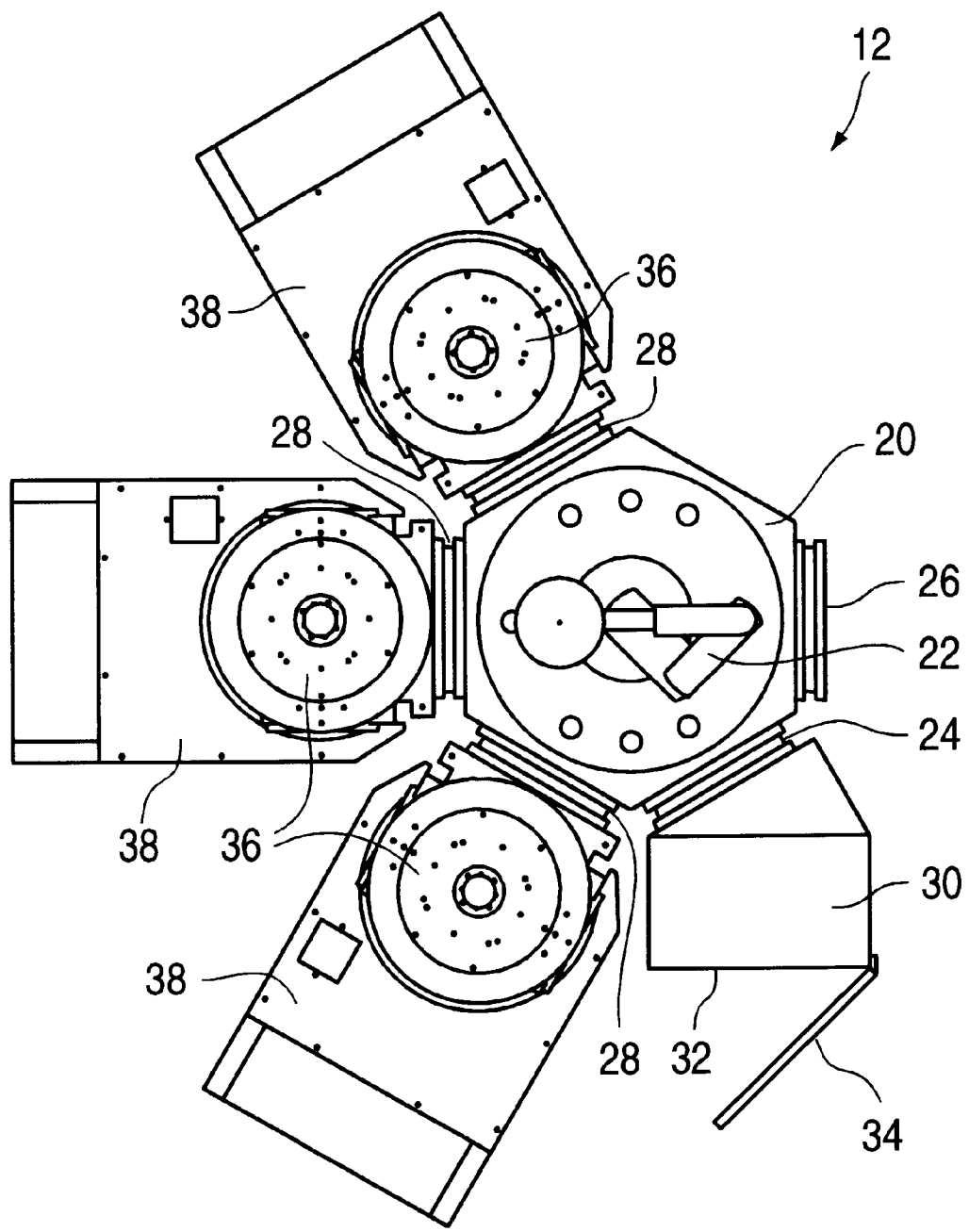
FIG. 2 is a top view of the first cluster tool of the integrated processing system shown in FIG. 1.

A top view of the cluster tool 12 of the integrated processing system 10 is shown in FIG. 2. Although the cluster tool 12 is shown with three processing modules 38, processing modules may added to or removed from the cluster tool 12 as needed. The processing modules 38 are coupled to a central wafer handler mechanism (or robotic chamber) 20 at ports 28. Ports 28 allow each processing module 38 to be sealed during processing. An interface unit (or cassette loadlock chamber) 30 is also coupled to the wafer handler mechanism 20 at port 24. Port 24 allows the wafer handler mechanism 20 and modules 38 to be sealed off from the interface unit 30 during loading and/or unloading of the wafers into the interface unit 30. The interface unit 30 includes at least one access mechanism (a door 34 and opening 32 are shown) for wafer entry/exit from the integrated processing system 10.

A wafer or a cassette of wafers (hereinafter referred to as simply wafer) may be introduced into the cluster tool 12 through an entry door 34 located on the interface unit 30. (The interface unit 30 is often referred to as a load-station for loading and unloading the wafers.) During loading of a wafer, the port 24 is typically sealed to prevent exposure of the cluster tool 12 to the ambient conditions. After a wafer is loaded into the interface unit 30, the door 34 is closed and the wafer is sealed within the interface unit 30. Depending on the use, the interface unit 30 may be designed to operate while filled with a non-active gas, such as nitrogen, or be designed to provide a vacuum environment. The interface unit 30 can also be used to prepare the wafer for the first processing step. For example, the environment within the interface unit 30 can be brought to the desired pressure and temperature for the first processing step. Note that the interface unit 30 has many possible variations and options. For example, the interface unit 30 may contain a through-wall mounting frame with door-panels and/or a wafer aligner. These features make the loading of a wafer or a cassette of wafers into the integrated processing system 10 quicker, easier, and more consistent in terms of initial wafer placement within the interface unit 30. Other often-required interface capabilities may be implemented, such as standardized mechanical interfaces (SMIF) and automatically guided vehicle (AGV) compatibility, etc.

Once the cassette of wafers is loaded into the interface unit 30 and the environment within the interface unit 30 is established, the port 24 is opened. A robot arm 22, housed within the wafer handler mechanism 20, transfers the wafers from the cassette in the interface unit 30 and into a processing module 38 for processing within a first environment. The robot arm 22 typically is movable/controllable in at least three-axis. It is appreciated that there are a variety of designs and techniques known in the prior art for moving the wafer through the cluster tool 12. The particular description herein and the robot arm 22 shown in FIGS. 1 and 2 are for exemplary purposes only.

Figure 3:
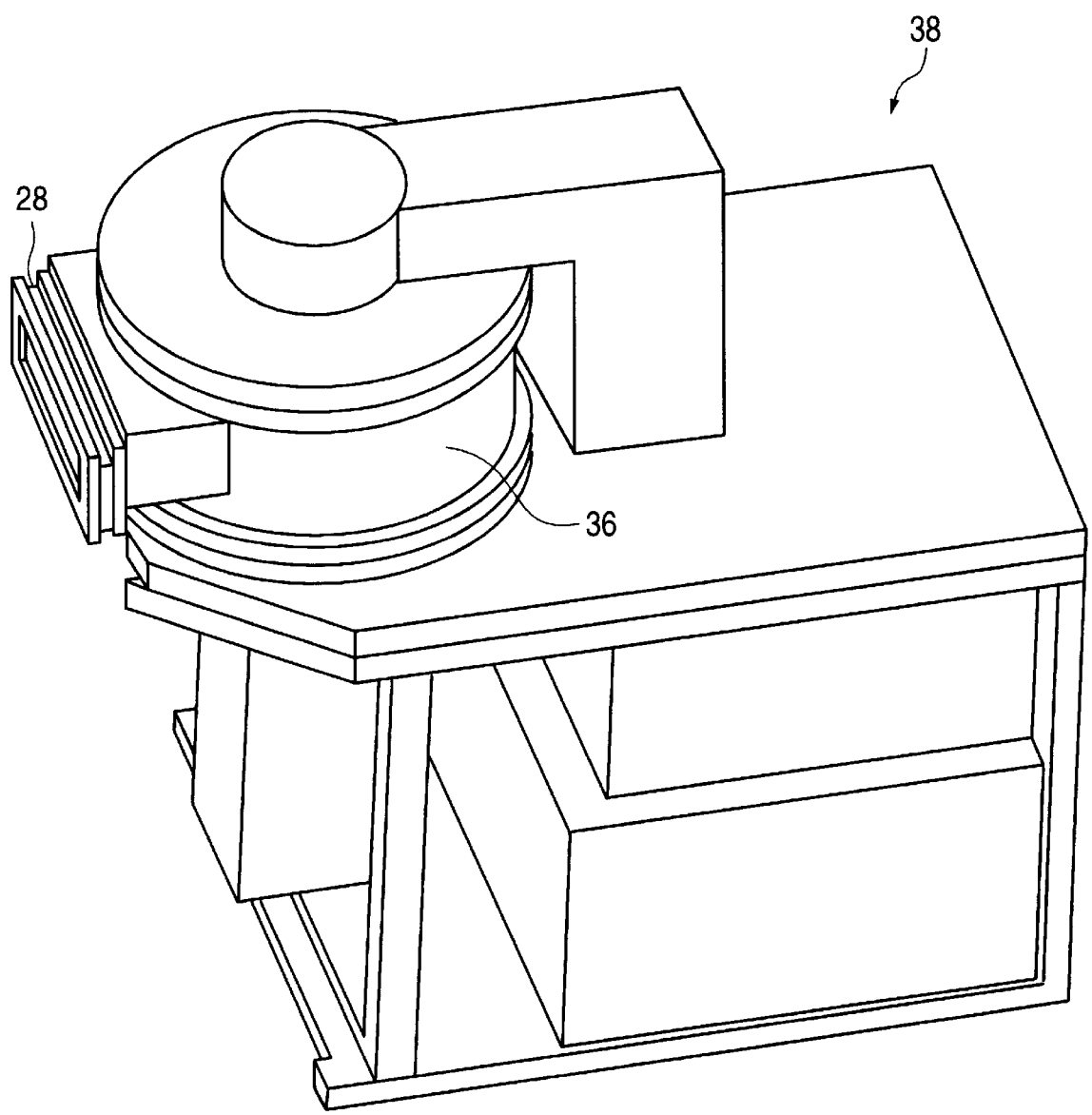
FIG. 3 is a pictorial illustration of a processing module used with the first cluster tool shown in FIG. 2.

The processing module 38 houses a processing chamber 36 therein. A pictorial illustration of the processing module 38 is shown in FIG. 3. The processing module (or housing) 38 is a modular unit designed to house the processing chamber 36 and its associated mechanical and electrical components, such as electrical wiring, fluid distribution piping, couplings to external system components, and mechanisms for rotating/oscillating and raising/lowering internal components of the processing chamber 36. The processing chemical (or electrolyte), de-ionized (DI) water, nitrogen and vacuum connections are made to the module 38 for distribution to the processing chamber 36. A drain from the processing chamber 36 is coupled to a container for containing the electrolyte or to a waste treatment component of the system. It is appreciated that the delivery and removal of such chemicals and fluids to/from a processing chamber are known in the art. Thus, module 38 is but one example of how the processing chamber 36 and its external components may be configured.

The processing chamber 36 housed within the processing module 38 may vary depending on the processing step applied by that particular processing chamber. A variety of processing steps and their respective chambers currently known in the art may be used as the processing chambers of the present invention. For example, if an electroplating or electropolishing process is involved, one implementation is the use of a single wafer processing chamber module as described in U.S. patent application entitled "Process Chamber and Method for Depositing and/or Removing Material on a Substrate," Ser. No. 08/916,564, filed Aug. 22, 1997, which is incorporated herein by reference. Another implementation is the use of a multiple station processing chamber as described in U.S. patent application entitled "Multiple Station Processing Chamber and Method for Depositing and/or Removing Material on a Substrate", Ser. No. 09/118,664, filed Jul. 17, 1998, which is incorporated herein by reference.

In the example shown, cluster tools 12 and 14 are depicted as each having a cluster of three processing modules 38. It is appreciated that the actual numbers of such modules in a cluster is a design choice, and that the two cluster tools 12 and 14 need not have the same number of modules. Furthermore, although the handler mechanism 20 is shown as a hexagonal shape with three external ports 24, 26, and 28, other shapes for the handler mechanism 20 may be deemed more suitable. The shape of the handler mechanism 20 is typically determined by the spatial requirements of the robot arm 22 housed within the wafer handler mechanism 20 and the number of ports needed for coupling various components of the cluster tool 12 to the cluster tool 20.

Located around the periphery of the wafer handler mechanism 20 are ports 24, 26, and 28. Each port 24, 26, and 28 is comprised of an opening allowing a wafer to pass through the port from one component of the cluster tool 12 to another component. Each port may be completely sealed off, such that each port may serve as an isolation barrier between the various components of the cluster tool 12. In this manner, different components of the cluster tool 12 may be isolated from the rest of the cluster tool 12 at any given time, and thus the various components of cluster tool 12 may operate at different environmental conditions if required.

When more than one processing modules 38 are coupled to the handler mechanism 20, each processing module 38 may provide the same processing step(s) or the modules 38 may be configured to provide different processing steps, or any combination thereof. If more than one processing modules are present and each module 38 provides the same processing step, the robot arm 22 will typically transfer each wafer from the cassette of wafers placed in the interface 30 to one of the processing modules 38 for processing. However, if more than one processing modules 38 are present and each module 38 provides a different processing step, the robot arm 22 will typically transfer each wafer from the cassette of wafers placed in the interface unit 30 to a first module 38 for a first processing step and then to each subsequent module 38 for subsequent processing steps.

Once the wafers have been processed in the processing modules 38, the robot arm 22 will transfer the wafers from the processing modules 38 and place the wafers in the connecting interface chamber 16 (shown in FIG. 1). Once the wafers have been placed within the connecting interface chamber 16, the port 26 will typically be closed and the wafers will be sealed within the connecting interface chamber 16. (Note that port 40 is typically already sealed so that cluster tool 14 remains isolated from cluster tool 12 during processing.) Conditions within the sealed connecting interface chamber 16 may be changed to accommodate the setup and/or preparation of the wafer for processing in the second cluster tool 14. For example, if the processes applied in cluster tool 12 had operated at a low pressure (or in a vacuum), and the processes to be applied in cluster tool 14 operated at ambient pressure, the connecting interface chamber 16 could be used for any necessary preparations required before inserting the wafer into the new environment. Similarly, temperature adjustments could be made.

After the intermediate preparation of the wafer is complete, the port 40 is opened and the connecting interface chamber 16 is opened to the second cluster tool 14. The cluster tool 14 as shown has the same design as cluster tool 12 (shown in FIG. 2), although cluster tool 14 generally processes the wafers in a second environment that is often not compatible with the processing steps applied in cluster tool 12. (Note, however, that the cluster tools 12 and 14 are not required to have the same or similar designs.) A second robot arm 22 is housed in a second wafer handler mechanism (or robotic chamber) 20 that is coupled to the connecting interface chamber 16 at port 40. The second robot arm 22 removes the wafers from the connecting interface chamber 16 and places the wafers in one of the processing modules 38 of the second cluster tool 14.

If all processing modules 38 of the second cluster tool 14 provide the same processing step, the second robot arm 22 will transfer the wafers to a processing module 38 for processing. If the processing modules 38 provide different processing steps, the robot arm 22 will position the wafer in a first processing module 38 for a first processing step and then transfer the wafer to subsequent modules 38 for subsequent processing steps. Note that the robot arm 22 can deliver the wafer to the processing modules 38 in any order, and if desired, certain processing steps can easily be repeated. Once the wafer has completed the required processing steps, the robot arm 22 places the wafer in the second interface unit 30. Once the wafers are placed in the second interface unit 30, the second port opening 24 is sealed. Any final preparations, for example the removal of any residual moisture, may be provided within the second interface unit 30. Then, the exit door 34 may be opened and the wafers removed from the integrated processing system 10.

In the preferred embodiment, wafer transport system 12 is used to apply a base layer, comprised of a barrier layer and a seed layer, to a wafer while operating in a low pressure (or vacuum) environment. The entire cluster tool 12 could be kept in a vacuum environment by isolating cluster tools 12 and 14 by closing the ports 26 and/or 40 of the connecting interface chamber 16. Once the barrier and seed layers have been provided by cluster tool 12, the wafer is then transferred to cluster tool 14 via the connecting interface chamber 16. Cluster tool 14 is then used to apply subsequent processing steps at a second environment, for example copper deposition plating processes operating at ambient pressure. As with cluster tool 12, the entire cluster tool 14 could be kept at ambient pressure by isolating cluster tools 12 and 14 by closing the ports 26 and/or 40 of the connecting interface chamber 16. In this manner, some processes are applied to the wafers at a vacuum environment in a first processing system and some processes are applied at ambient pressure in a second processing system. Further, since the connecting interface chamber 16 transfers the wafers from the first cluster tool 12 to the second cluster tool 14, wafers no longer have to be unloaded, transferred, and reloaded by an operator. This arrangement also eliminates the waiting time between vacuum processing and non-vacuum processing (plating). Thus, the present invention eliminates a step previously required when processing wafers in a series of non-compatible processing steps.

Note that it is also possible to use the cluster tools 12 and 14 independently. If using only cluster tool 12, the cluster tool 12 will be isolated and sealed off from cluster tool 14 at ports 26 and/or 40. Once the wafers have been processed within the processing chambers 36, the wafers could be removed from the cluster tool 12 via the interface unit 30. Alternatively, the cluster tool 12 may have a second interface unit 30 coupled to the wafer handler mechanism 20. A second interface unit 30 would allow wafers to be inserted into the cluster tool 12 through a first interface unit 30 and then removed from the cluster tool 12 through a second interface unit 30. A second interface unit 30 could also provide a second entry port for loading wafers into the integrated processing system 10. The use of each of these options and variations thereon depends on the number and sequence of the processing steps involved, the number of wafers being processed within the cluster tool 12, and the throughput requirements of the cluster tool 12 and/or the integrated processing system 10.

In the same manner, cluster tool 14 may operate independently of cluster tool 12. If operating independently, cluster tool 14 will typically be sealed off from cluster tool 12 at ports 26 and/or 40. Another interface unit 30 can also be added to cluster tool 14 to assist in the workflow of the wafers being processed in the independent cluster tool 14 or to provide a second exit port for the integrated processing system 10. As with cluster tool 12, the use of each of these options and variations thereon depends on the number and sequence of the processing steps, the number of wafers being processed within the cluster tool 14, and the throughput requirements of the cluster tool 14 and/or the integrated processing system 10.

Figure 4:
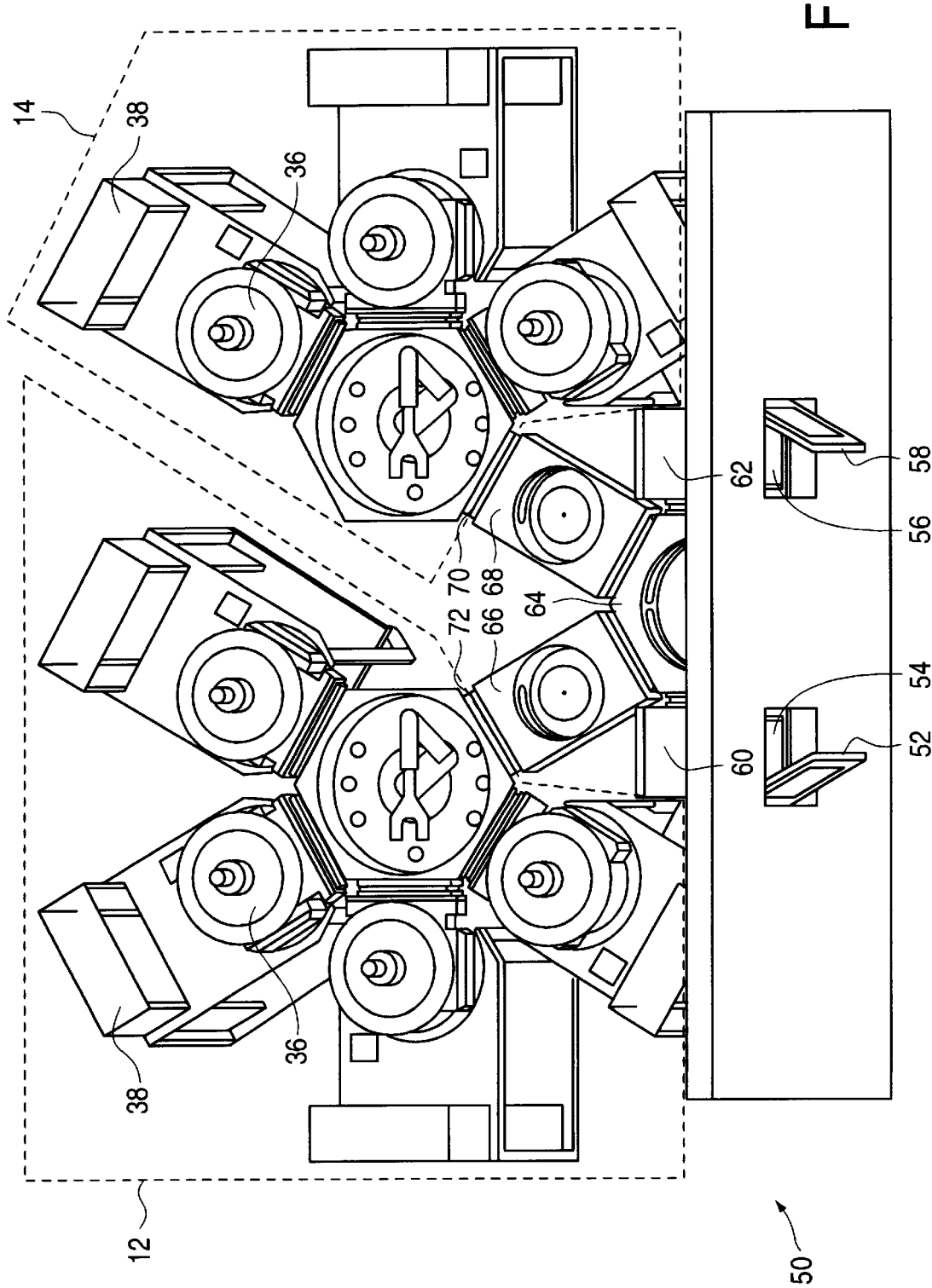
FIG. 4 is a pictorial illustration of a second embodiment of an integrated processing system of the present invention.

FIG. 4 is a pictorial illustration of a second embodiment of the present invention showing an integrated processing system 50. The integrated processing system 50 further isolates the first cluster tool 12 from the second cluster tool 14 through use of a third robot arm housed within a third wafer handler mechanism (or robotic chamber) 64. Although the integrated processing system 50 has a larger footprint (area required by the system 50 as a whole) than the integrated processing system 10, the integrated processing system 50 has more ports available for added processing modules 38, which allows for a higher output through the processing system 50 as a whole. Further, system 50 is more flexible since it can feed wafers to cluster tools 12 and 14 independently rather than serially.

Figure 5:
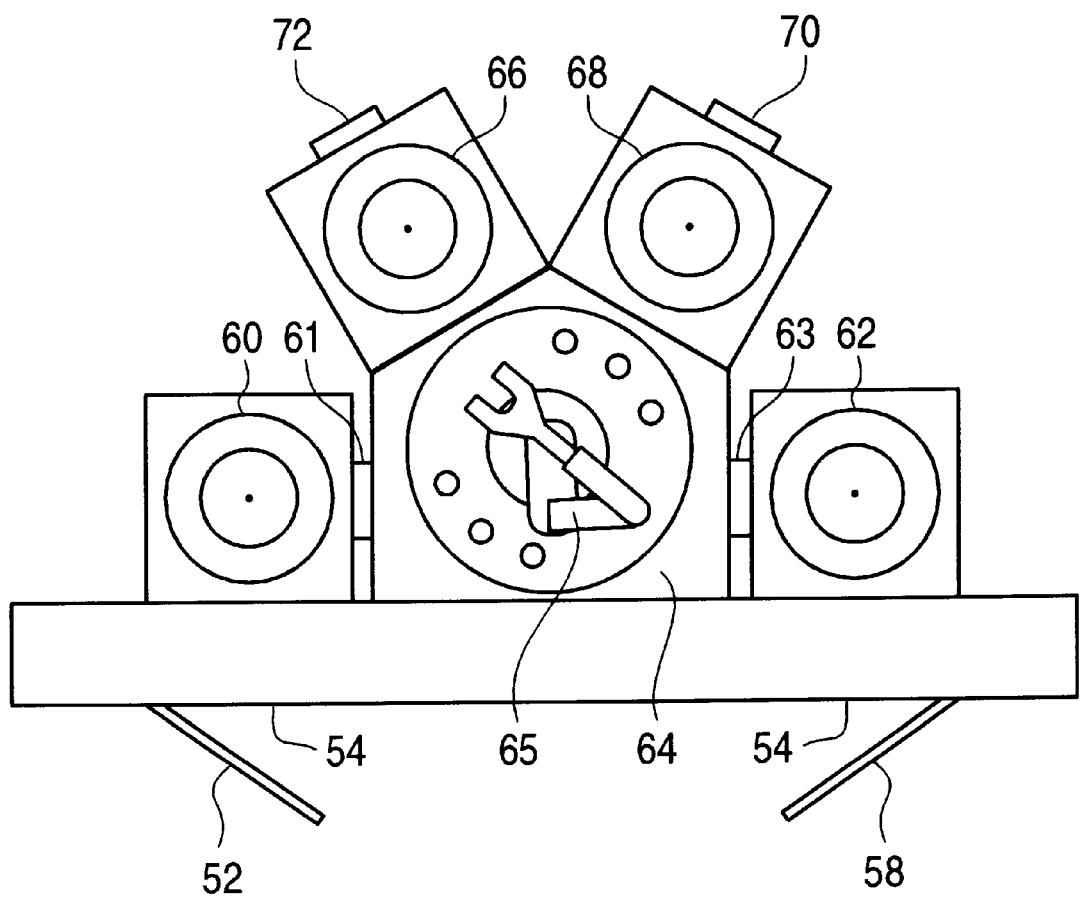
FIG. 5 is a top view of the interface units and connecting chambers of the integrated processing system shown in FIG. 4.

As with system 10, a wafer or a cassette of wafers may be introduced into integrated processing system 50 through an entry door 52 located on the interface unit 60, as shown in FIG. 5. Once the wafers are placed within the interface unit 60 and the environment within the interface unit 60 is established, the port 61 is opened. A robot arm 65, housed within the wafer handler mechanism 64, transfers the wafers from the cassette in the interface unit 60 and into the connecting interface chamber 66. If necessary, preparatory processes may be applied to the wafers in the connecting interface chamber 60 to prepare the wafers for processing in cluster tool 12. Once the wafers are ready for processing, port 72 is opened and the robot 22 of cluster tool 12 transfers the wafers from the connecting interface chamber 66 to the processing modules 38 as described above in the first embodiment.

Once the wafers have completed the processing steps applied by cluster tool 12, the robot arm 22 returns the wafers to the connecting interface chamber 66. The robot arm 65 of the third wafer handler mechanism 64 then transfers the wafers from the connecting interface chamber 66 to the connecting interface chamber 68. Once the wafers are sealed within the connecting interface chamber 68 and any preparatory steps are completed, the port 70 opens and the robot arm 22 of cluster tool 14 transfers the wafers from the connecting interface chamber 68 to the processing chambers 36 of cluster tool 14. Once all processing steps provided by cluster tool 14 are completed, the robot arm 22 returns the wafers to the connecting interface chamber 68. The third robot arm 65 then transfers the wafers from the connecting interface chamber 68 into the interface unit 62. The wafers may then be removed from the integrated processing system 50 through the opening 54 on the interface unit 62. Note that as the wafers are transferred from component to component throughout the integrated processing system 50, the wafers pass through several ports which may or may not be sealed, depending on whether that particular component needs to be isolated.

A third embodiment of the present invention may also be comprised of a first processing chamber coupled to a second processing chamber by a connecting interface chamber. As described above with the cluster tools, the connecting interface chamber isolates each processing chamber from the other processing chamber. A wafer handling mechanism housed within the connecting interface chamber transfers the wafers from the first processing chamber to the second processing chamber. In this manner, wafers are processed in a first isolated environment of a first processing chamber and then transferred and processed in a second isolated environment of a second processing chamber. Since the transfer of the wafers between processing steps occurs within the connecting interface chamber, the wafers are not exposed to ambient conditions. The processing chambers, connecting interface chamber, and wafer handling mechanism of this third embodiment are the same as those described above in the first and second embodiments.

Each of the above embodiments of the present invention may be modified to operate in different configurations. For example, linear cluster tools may be used along with the radial cluster tools shown above. The linear and radial cluster tools may be used independently or in combination. Further, although the present invention has been described with respect to the deposition of a metal on a wafer, other processes can be performed on semiconductor wafers or other substrates using the present invention.

Thus, the present invention describes a method and apparatus for use in processing a substrate in which multiple processes are performed on the substrate within a controlled environment, such that certain processes may be isolated from other processes. The present invention allows a substrate to be moved from a sealed processing chamber operating in a first environment to a sealed processing chamber operating in a second environment, without the substrate being exposed to ambient conditions, thus avoiding the possibility of oxidizing or contaminating the seed layer surface before plating. The present invention also eliminates the need for substrates to be reloaded into different processing chambers for different processing steps. Instead, the substrates may be loaded into a single system, where the substrates undergo multiple processes and are then removed from the system. Thus, the substrates are only loaded and unloaded once for the entire process. This saves significant time in addition to reducing the exposure of the substrates to the ambient environment.

We claim:

1. An apparatus for processing a substrate, comprising:
   a first processing chamber for processing the substrate in a low pressure first environment;
   a second processing chamber for electroplating the substrate in a second environment different than the first environment; and
   a connecting interface coupled to said first and second processing chambers for transporting the substrate between said first processing chamber and said second processing chamber in a controlled environment, wherein said first processing chamber and said second processing chamber may be isolated by said connecting interface.

2. The apparatus of claim 1 wherein said first environment is a low pressure environment.

3. The apparatus of claim 2 wherein said second environment is at ambient pressure.

4. The apparatus of claim 3 wherein said first processing chamber applies a barrier layer and a seed layer to the substrate.

5. The apparatus of claim 1 wherein said first processing chamber is a cluster tool for processing the substrate.

6. The apparatus of claim 5 wherein said second processing chamber is a cluster tool for processing the substrate.

7. An apparatus for processing a substrate, comprising:
- a first cluster tool including a first processing chamber for processing the substrate in a low pressure first environment;
- a second cluster tool including a second processing chamber for electroplating the substrate in a second environment different than the first environment; and,
- a connecting interface coupled to said first and second cluster tools for transporting the substrate between said first cluster tool and said second cluster tool in a controlled environment, wherein said first cluster tool and said second cluster tool may be isolated by said connecting interface.

8. The apparatus of claim 7 wherein said first cluster tool has a first wafer handling mechanism with at least one first processing chamber coupled thereto, and said second cluster tool has a second wafer handling mechanism with at least one second processing chamber coupled thereto.

9. The apparatus of claim 8 wherein said first wafer handling mechanism transfers the substrate from said at least one first processing chamber to said connecting interface, and said second wafer handling mechanism transfers the substrate from said connecting interface to said at least one second processing chamber.

10. The apparatus of claim 9 wherein said first environment is a low pressure environment.

11. The apparatus of claim 10 wherein said second environment is at ambient pressure.

12. The apparatus of claim 11 wherein said first processing chamber applies a barrier layer and a seed layer to the substrate.

13. A method of processing a substrate, comprising the steps of:
- providing a first processing chamber for processing the substrate in a first environment;
- placing the substrate in said first processing chamber;
- processing the substrate in said first processing chamber;
- providing a connecting interface coupled to said first processing chamber;
- providing a second processing chamber for processing the substrate in a second environment different than the first environment, said second processing chamber coupled to said connecting interface;
- transferring the substrate from said first processing chamber through said connecting interface into said second processing chamber, such that said first processing chamber is environmentally isolated from said second processing chamber; and
- electroplating the substrate in said second processing chamber.

14. The method of claim 13 wherein said step of providing a first processing chamber further includes providing a cluster tool for processing said substrate.

15. The method of claim 14 wherein said step of providing a second processing chamber further includes providing a cluster tool for processing said substrate.

16. The method of claim 15 wherein said step of processing the substrate in said first processing chamber further includes processing said substrate in a low pressure environment.

17. The method of claim 16 wherein said step of processing the substrate in said second processing chamber further includes processing the substrate at ambient pressure.

18. The method of claim 17 wherein said step of processing the substrate in said first processing chamber further includes providing a barrier layer and a seed layer on the substrate.

* * * * *